MULTISTAGE WIDE-BAND TRANSISTOR AMPLIFIER
Filed July 26, 1965 3 Sheets-Sheet 1
Fig. 1
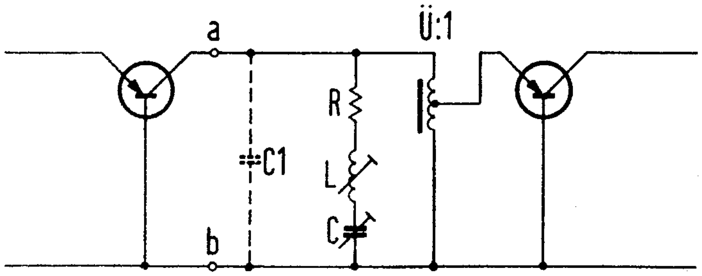
Fig. 2
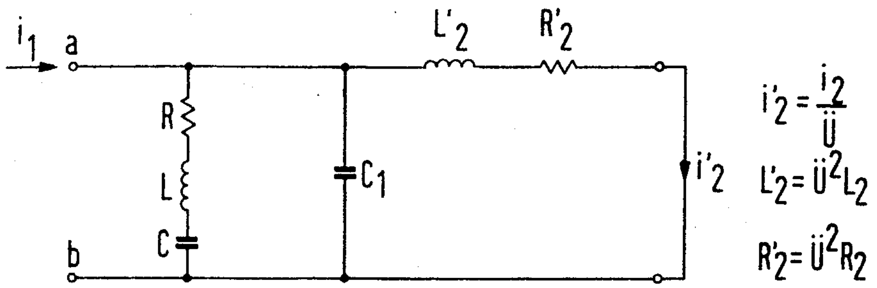
Fig. 3
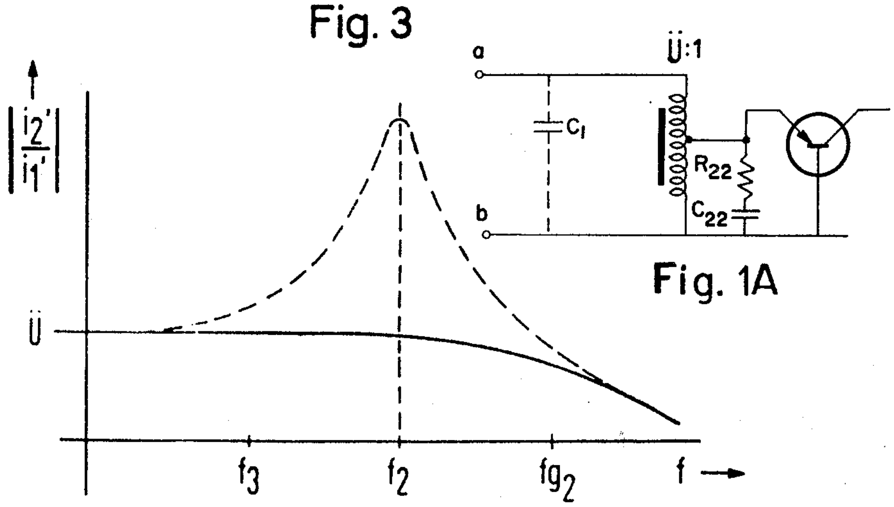
Fig. 3, Fig. 1A
INVENTOR
WOLFGANG ULMER
BY Stiee & Stiee
ATTORNEYS INVENTOR
Wolfgang Ulmer
BY Spencer & Spencer
ATTORNEYS INVENTOR
WOLFGANG ULMER
BY Stiee & Stiee
ATTORNEYS United States Patent Office 3,461,394
Patented Aug. 12, 1969

3,461,394
MULTISTAGE WIDE-BAND TRANSISTOR AMPLIFIER

Wolfgang Ulmer, Munich, Germany, assignor to Siemens Aktiengesellschaft, a corporation of Germany
Filed July 26, 1965, Ser. No. 474,610
Claims priority, application Germany, July 28, 1964, S 92,308
Int. Cl. H03f *1/42, 3/04*
U.S. Cl. 330—21 7 Claims

ABSTRACT OF THE DISCLOSURE

A multistage broad-band transistor amplifier having interstage coupling networks which include a series resonant circuit in parallel with an autotransformer to provide a flat frequency response curve.

The invention relates to a multistage wide-band transistor amplifier of which individual amplifier stages, preferably common base connection, are coupled in each case by means of a transformer, especially an autotransformer.

In directional radio engineering particularly, wide-band amplifiers are needed which operate, for example, in the frequency range of about 70 mc. with a band width of, say, 20 to 100 mc. and produce relatively high amplification values. They are utilized in directional radio engineering, especially as intermediate frequency amplifiers. In these amplifiers it is required, on the one hand, that the course of the amplification have, in dependence on the frequency within the required pass range, as low as possible a change, preferably less than 0.1 db (amplitude curve), and on the other hand, that the transit times of the frequencies within the pass range (hereinafter referred to as "group transit times"), for example, through the whole amplifier, have a maximum variation which is as low as possible, such as only a few tenths of a nano-second.

In the transistors presently available with alpha limit frequencies on the order of a few 100 mc. the first requirement leads frequently to the use of a common base connection. It is conceivable, however, that with transistors of considerably higher limit frequency the utilization of common emitter connection becomes technically reasonable. For the coupling of the individual amplifier stages there have been known, primarily two kinds of couplings, one a coupling over band passes which directly determine the band frequencies of the multistage amplifier, and the other a coupling of individual amplifier stages over low passes with simultaneous establishment of the band limits of the required pass range by filter circuits, which are connected before and/or following the multistage transistor amplifier. The first mentioned arrangement presents, in view of the demand for as little variation as possible in the group transit times within the required pass range, relatively great difficulties, because particularly at the band limits, strong phase rotations and accordingly changes occur in the group transit times. For this reason a coupling over low pass members is preferred. These low pass members can there be formed by transformers, especially autotransformers, which have a high main inductance, and change their transformation characteristics as little as possible within the required pass range. The construction of the individual coupling four-pole in the manner of a low pass transformer has, however, in the prior known forms, a considerable drawback, because it is decisively necessary that the amplitude curve be as flat as possible. As a result, the amplification attainable per amplifier stage is lower than in the case of band pass couplings, the so-called 3 db frequency having to be placed far above the upper limit frequency of the required pass range. Through use of a feedback within the individual amplifier stage, which extends from the coupling transformer to the base circuit of the preceding transistor, it is possible, to a certain extent, to compensate for this drop, but, besides the difficulty of more complicated construction, there is also obtained the additional danger of undesired phase shifts.

The invention has as its basic problem that of so constructing a multistage wide-band amplifier with transistors that even extreme requirements for a flatness of the amplitude curve and for as little variation as possible in the group transit times are taken into account. Above all, it is required that on subdivision of the multistage amplifier into several amplifier groups with, in each case, several amplifier stages, and interposition of controllable attentuation members for the regulation of the amplification of the whole amplifier, these favorable electrical values are hardly altered, or at least not objectionably altered. For a multistage transistor amplifier according to the invention there should also be fulfilled, among other things, as far as possible, the requirement that such regulatable attenuation four-poles need not necessarily have within the regulating range constant input and/or output resistance.

A flat amplitude response characteristic over a broad frequency range is obtained in the present invention by utilizing a loss producing parallel branch of series resonant elements on the primary or secondary side of a transformer which is connected between amplifier stages. The amplifier stages may be common base connected transistors.

Advantageous forms of construction of a transistor amplifier according to the invention include the following:

The cross branch, connected on the primary side of the transformer, is a series resonance circuit whose circuit quality is greatly reduced by means of an ohmic resistor, and so designed that the resonance frequency of such series resonance circuit is appreciably below the upper limit frequency of the amplifier, preferably in the vicinity of half the limit frequency.

The cross branch may be provided on the secondary side of the transformer, consisting of a series circuit having a capacitor and an ohmic resistor, the capacitance of the capacitor together with the stray inductance of the transformer forming the series resonance which produces a flattening of the amplitude curve.

The transformer is connected with the preceding transistor stage in each case over a coupling capacitor whose capacitance value is selected so high that the lower limit frequency of the amplifier lies far below the lower limit frequency of the required pass range, the lower limit frequency of the required pass range being established by filter circuits connected ahead and/or following, constructed, in particular, as a high pass.

The transformer coupling and the cross branch are so dimensioned that the upper limit frequency of the amplifier lies appreciably above the upper limit frequency of the required pass range, and through filter circuits connected ahead and/or after the multistage amplifier the upper limit frequency of the required pass range is established.

The transformer is constructed with as high as possible a main inductance and as low as possible a stray inductance, preferably in the form of ring core transformer.

The multistage amplifier is subdivided into several amplifier groups, each including several amplifier stages, and between the amplifier groups there are inserted regulatable attenuation members for achieving the amplifier regulation, the regulating range of such members preferably corresponding in each case to about the amplification value of the preceding amplifier stage group.

A progressive regulation of the system is provided whereby, in each case, initially the last attenuation four-pole in transmission direction is regulated to its maximum in the case of rising signal level and only thereafter the regulation system disposed immediately ahead of it.

The attenuation four-pole is so constructed in each case that with maximum transmission attenuation and with minimum transmission attenuation it has practically flat amplitude curve and transit time curve.

In this formation of the individual amplifier stage in common base connection, at the primary side of the transformer, and preferably in transmission direction, there is provided, following the connection of the cross branch effecting the series resonance, a temperature compensating bipole, particularly in the form of a temperature-dependent resistor connected parallel to an inductance.

The invention is explained in detail with the aid of the drawings, in which:

FIG. 1 is a basic circuit diagram of two transistor amplifier stages which are coupled according to the invention;

FIG. 1A illustrates a modification of the circuit of FIGURE 1;

FIG. 2 is an equivalent diagram for the amplifier circuit of FIG. 1;

FIG. 3 is a graph illustrating the characteristics of the circuit of FIG. 1 with respect to frequency;

FIG. 1 is a basic circuit diagram illustrating two transistor stages connected in common base connection, which are coupled according to the invention over an autotransformer 1. In parallel with the primary side of the autotransformer, which is stepped down in the direction of the second transistor, there extends a series circuit comprising a resistor R, an adjustable inductance L and an adjustable capacitor C. Between such circuit and the output of the preceding transistor, in transmission direction, there also exists, in parallel with the output, effective circuit capacitance C1. The second transistor, in common base connection, in transmission direction presents a very good approximation of a series circuit comprising an inductance $L_2$ and an ohmic resistor R2. There thus results, as viewed from the output terminals *a*, *b* of the first transistor in transmission direction into the input terminals of the second transistor, an equivalent circuit diagram as illustrated in FIG. 2. However, in the latter in the input values of the second transistor there are also included the stray inductance of the autotransformer and its ohmic losses, with simultaneous transformation of the (in FIG. 1) secondary side values to the primary side. Therefore, the relations additionally depicted in FIG. 2 are applicable.

If such a circuit is considered, first without the cross branch R, L, C, there then results a frequency dependence for the ratio *I2/I1* as depicted in broken lines in FIG. 3. As a result of the presence of C1 there occurs a parallel resonance, for example, at a frequency *f*2, which produces a strong excessive increase and which thereby, in the case of a requirement of an amplitude curve which is as flat as possible restricts the utilizable range. According to the invention, there is inserted the cross branch R, L, C, the resonant frequency of which is selected below *f*2 at *f*3, which makes it possible to achieve the result that the amplitude course corresponds to that illustrated by a solid line in FIG. 3. There is obtained a so-called 3 db limit frequency $f_{g2}$ which still lies far above *f*2 and assures, up into the range of *f*2, an extremely flat amplitude course. FIGURE 1A illustrates a modification of the invention of FIGURE 1 in which the series circuit comprising resistor R, the inductance L and the capacitor C has been replaced with a resistor $R_{22}$ and capacitor $C_{22}$ on the secondary side of the transformer U1 and the stray inductance of the transformer and capacitor 22 provide the desired series resonant circuit.

Figures 4, 5, 7:
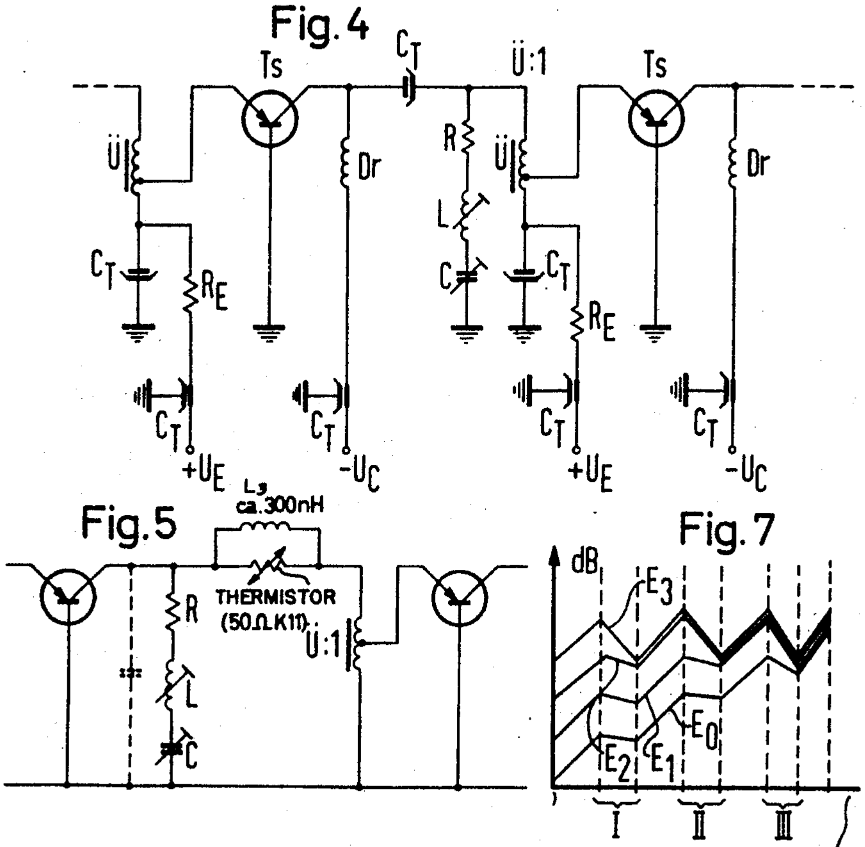
FIG. 4 shows a coupling stage with a transformer and a series resonant circuit connected in parallel with the transformer.
FIG. 5 illustrates a circuit for providing temperature compensation.
FIG. 7 is a graph illustrating the amplification through an amplifier such as illustrated in FIG. 6.

While FIG. 1 illustrates a basic circuit diagram, FIG. 4 presents this circuit in somewhat greater detail, particularly with respect to a consideration of the direct current supplies. In FIG. 4 bypass capacitors $C_T$ are provided, the capacitance values of which are so selected that they form a separation for direct current and as effective as possible a short circuit at the frequencies of the signals to be transmitted. High frequency chokes are so low-ohmic for direct current that they can be regarded as a short circuit, while at the operating frequencies of the signals they should be very high-ohmic. Resistors $R_E$ serve for the feed of the emitter current to the two transistors T*s*, R, L, C being the cross branch to be provided according to the invention, while the autotransformer Ü is constructed as a wide-band transformer. The transistors T*s* are assumed to be pnp transistors, so that as viewed from ground, the emitters are fed from a positive bias voltage source $U_E$ and the collectors from a negative voltage source $-U_c$. Instead of pnp transistors, with corresponding pole reversal of the operating voltage sources, npn transistors are likewise usable. Instead of autotransformers it is also possible to use transformers with separate windings, whereby the high frequency chokes D*r* can be eliminated, but resulting in a somewhat higher expenditure in the individual transformers.

Consider purely mathematically, there holds for the circuit according to FIGS. 1 and 4, respectively, the following:

If the series circuit R, C, L is omitted, then at the frequency $$\omega_2 = \frac{1}{\sqrt{C_1 L_2'}}$$

there forms a resonance peak of the transmission function $$\left|\frac{i_2'}{i_1}\right|$$

If, parallel to $C_1$, there is now included the series circuit R, L, C, it is then possible to attenuate the resonance and obtain a flat course of the amplitude $$\left|\frac{i_2}{i_1}\right|$$

over a large frequency range. The equivalent circuit diagram of the circuit according to FIG. 2 is applicable, in which the main inductance of the transformer, which becomes evident only at low frequencies, was neglected. The transmission function has the form $$\left|\frac{i_2}{i_1}\right| = v_0 \frac{1+a_1 j\Omega + a_2 (j\Omega)^2}{1+k_1 j\Omega + k_2 (j\Omega)^2 + k_3 (j\Omega)^3 + k_4 (j\Omega)^4}$$

in which $$\Omega = \frac{\omega}{\omega_2}$$

and $$\omega_2 = \frac{1}{\sqrt{L_2' C_1}}$$

$a_1$, $a_2$, $k_2$, $k_3$, $k_4$ are independent frequency coefficients and $v_0$ is the current amplification at low frequencies $$v_0 = \ddot{u}$$

If the quality of the oscillatory circuit $C_1$, $L_2'$, $R_2'$ $$Q_2 = \frac{\omega_2 L_2'}{R_2'} \geq 10$$

then, from the conditions for a maximally flat amplitude course it is possible to present approximate solutions for the values of the series circuit. There obtains $$R \approx 0.9 \cdot \omega_2 L_2 = 0.9 Q_2 R'_2$$

$$L \approx 0.308 \cdot L_2'$$

$$C \approx \frac{1}{0.9 \cdot \omega_2 R_2'}$$

and from these $$R \cdot C \approx \frac{L_2'}{R_2'}$$

The maximal flat amplitude course of this circuit has the form $$\left|\frac{i_2}{i_1}\right| = \frac{v_0}{\sqrt{1+\frac{k_4{}^2 \Omega^8}{1+(a_1{}^2 - 2a_2)\Omega^2 + a_2{}^2 \Omega^4}}}$$

From this it is possible to calculate the upper limit frequency. For $Q_2 \geq 10$ there holds with good approximation $$f_{g2} = 1.48 f_2 \approx \sqrt{2} \cdot f_2 = \frac{2}{2\pi\sqrt{C_1 L_2'}} = \frac{1}{\ddot{u} \cdot \pi \sqrt{2 C_1 L_2}}$$

The lower limit frequency is determined by the main inductance $L_H$. The following holds $$f_{g1} = \frac{R_2'}{2\pi(L_H + L_2')} \approx \frac{R_2'}{2\pi L_H}$$

If $f_{g1} \ll f_{g2}'$, then the band width is almost as great as the upper limit frequency $$B \approx f_{g2}$$

and the product of band width times amplification is $$B \cdot v_0 \approx \frac{2}{2\pi\sqrt{C_1 L_2}}$$

This circuit has a band width-amplification product 3 db higher than a simple transformer coupling, in which the amplitude curve is flattened by increase of $R_2$, and avoids the drawback of the higher feedback effect which the feedback circuit originally mentioned involves. Consequently there can be inserted between the amplifier stages, simple directional conductor regulating stages, which do not have to be designed for constant Z, eliminating the possibility that in the amplification regulation the pass curve would impermissibly change. A further advantage is that the input resistance of the circuit is low-ohmic, whereby the influence of the transistor feedback effect on the input resistor of the base stage becomes smaller.

Since in the normal case both the input resistor of the transistor and also the ferrite cores generally used in the autotransformer have a certain temperature dependence, it is recommended that there be additionally provided a temperature compensation which will equalize any temperature-dependent fluctuations. An example of such circuit is shown in FIG. 5 in the form of a basic circuit diagram. Between the cross branches RLC and the primary side of the autotransformer there is inserted a parallel circuit of an inductance $L_3$ and a temperature dependent resistor (thermistor), the resistance value of which diminishes with increasing temperature. For example, for a frequency range of about 70 mc., with a band width of about 100 mc. the inductance may have a value of a few hundred nh. and the thermistor a resistance of about 50Ω at a room temperature of about 20° C. If the temperature of the transistors and of the transformer core increases in consequence of a rise in the room temperature, as is well known, the transistor input resistance will then become greater. At the same time, however, the thermistor becomes low-ohmic, so that the overall resistance $R_2'$ remains substantially constant.

For wide-band amplifiers, for example with a band width of about 40 mc. and a permissible regulation variation of about 0.5 decibel, a regulating four-pole advantageously is capable of a regulating range of about 10 to 15 decibels. A regulating four-pole means a quadripole in which the amplitude of signals may be adjusted. Since such amplifiers, in actual practice, must have a much greater regulating range, it is necessary to proceed in the manner indicated in FIG. 6, wherein several regulating four-poles are provided which are connected, preferably over multistage transistor amplifiers. In the case of narrow-band amplifiers the regulating four-pole is, under some circumstances, constructed for a greater regulating range. The amplification value of the amplifier stages lying between successive regulating four-poles are, in each case, then expediently dimensioned in the absolute value approximately equal to the maximally possible transmission attenuation of the preceding regulating four-pole.

While all of the individually regulating four-poles could be simultaneously regulated, for a wide-band amplifier, for example for a frequency range from 50 to 90 mc., it is advantageous to effect a progressive regulation in such a manner that, as the input level rises, regulation will take place in the last regulating four-pole in the transmission direction of the whole amplifier, until it reaches its maximum transmission attenuation. As the input level continues to rise, such regulating four-pole retains its maximum transmission attenuation and the immediately preceding regulating four-pole is rendered active, until it likewise reaches its maximum value. If the input level climbs still further, then both regulating four-poles remain set at their maximum transmission attenuation value and the next immediately preceding regulating four-pole is similarly rendered active.

This kind of progressive regulation, which is not limited with respect to the number of regulating four-poles employed, has, for wide-band amplifiers, the great advantage that the frequency characteristics of the amplifier can be favorably influenced within the regulating range. It is possible, for example, to insert in the individual regulating four-pole frequency-dependent resistors, in such a way that for minimum transmission attenuation of the four-pole and for maximum transmission attenuation thereof practically the same frequency characteristics result. It is only in the intervening regulating range that there results a slight change of the frequency characteristics. Since in the progressive regulation in each case only one regulating four-pole can exhibit this intermediate change of the frequency characteristics, accordingly even with many regulating stages, corresponding to a very large regulating range, the change of the frequency characteristics of the whole amplifier can be kept very small. More-over, through this progression of the regulation the noise factor of the amplifier as the input signal changes remains as low as possible.

The derivation of the regulating voltages particularly with respect to the progression between the regulating four-poles I, II and III can take place in such a manner that the output voltage of the amplifier in D is rectified and fed in parallel to three regulating voltage stages I', II', III'. To each of these regulating voltage stages there is allocated a certain threshold value of the rectified voltage, rising from regulating voltage stage to regulating voltage stage, following which the stage becomes active.

Figure 6:
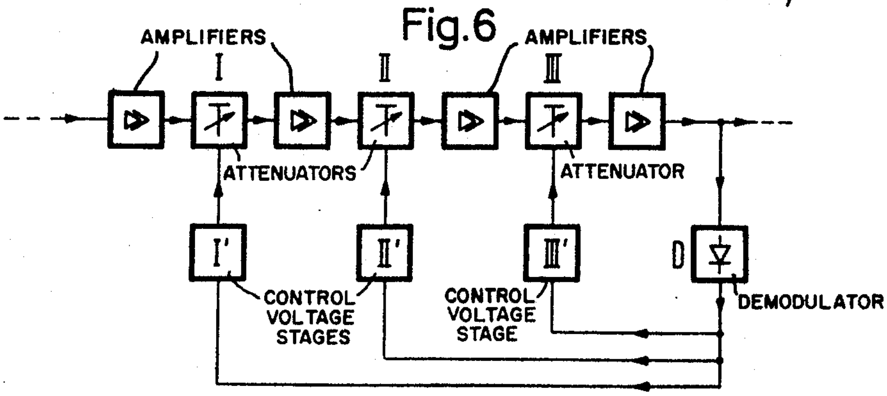
FIG. 6 illustrates, in block form, an arrangement for progressive regulation of a plurality of amplifiers for wide band operation.

Altogether there results for the amplifier according to FIG. 6 an amplification course through the amplifier as schematically illustrated in FIG. 7, in which four examples are shown, each with a different input voltage. The solidly drawn curve $E_0$ represents the case in which each regulating stage 6 operating at minimum transmission attenuation, i.e., the input signal still lies below the value at which the regulation will initially take place. With a somewhat higher input signal there results course E1 representing input signals which lie within the regulating range of the regulating four-pole III. For still greater input signals there result, analogously, the courses E2 and E3.

Figure 8:
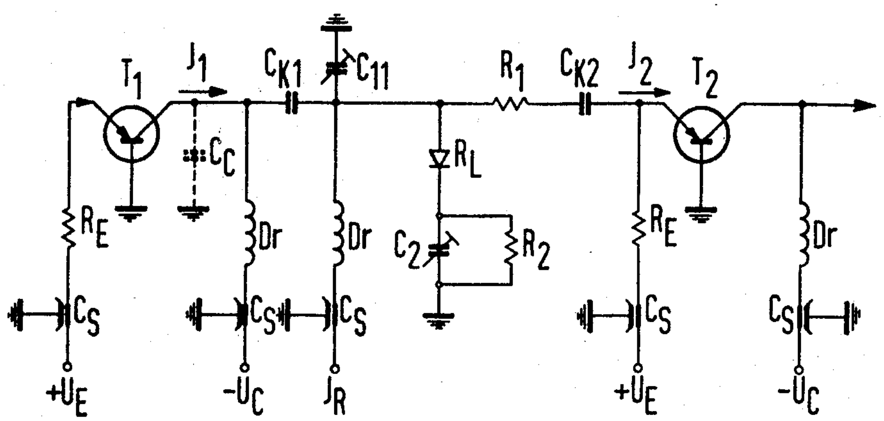
FIG. 8 illustrates an attenuation network for disposition between amplifier stages.
Figure 9:
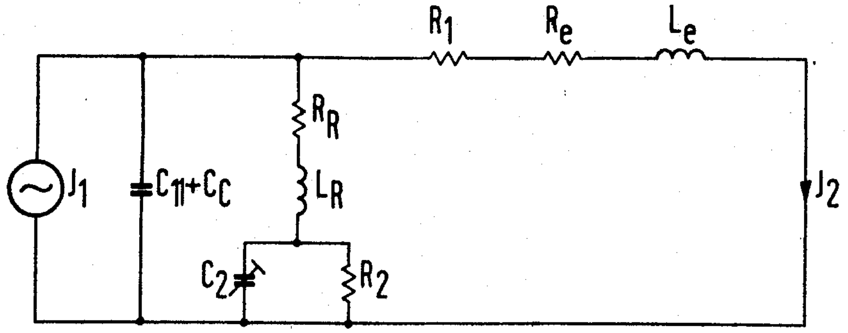
FIG. 9 is the equivalent circuit diagram for the attenuation network illustrated in FIG. 8.
Figure 10:
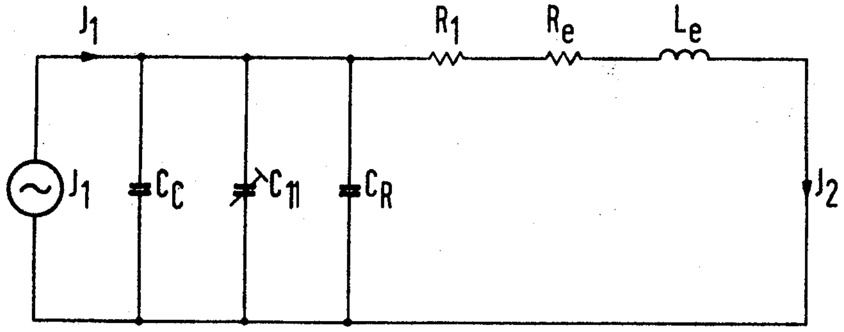
FIG. 10 is the corresponding equivalent diagram for minimum attenuation.

With respect to the directional conductor network serving for the attenuation regulation there is available, in particular, an arrangement such as is illustrated and considered in FIGS. 8, 9 and 10.

FIG. 8 illustrates a portion of a wide-band amplifier, in particular, the part which contains no amplifier networks, but only the attenuation network, with the amplifier stages of the amplified preceding and following the attenuation network. In FIG. 8 there are shown two transistor stages equipped with the transistors T1 and T2, which in this example are designed as common base stages, connected with one another over a coupling network controllable as to transmission attenuation. The resistors $R_E$ and the chokes *Dr* form the high-frequency de-coupled current feed to the transistors. Capacitors *Cs* provide the decoupling of the voltage sources from the circuit parts conducting the high frequency, while the supply voltages to the transistors are respectively designated as $+U_E$ and $-U_C$. The coupling network is connected at the input side over the capacitor $C_{K1}$ to the output of the transistor T1 and at the output side over capacitor $C_{K2}$ to the input of transistor T2. The selected capacitance value of these two capacitors is so high that their capacitive reactance at the operating frequency is therefore negligibly small in the pass range of the wide-band amplifier. The actual regulatable coupling network consists of a resistor $R_1$, which is inserted in the circuit between the two coupling capacitors $C_{K1}$ and $C_{K2}$, as well as a directional conductor RL, to which there is inserted in series a parallel circuit comprising a capacitor $C_2$ whose capacitance value is variable, and a resistor $R_2$. In parallel with this direction conductor branch is another capacitance $C_{11}$ of variable capacitance which is connected to ground. The directional conductor RL likewise leads from the connection of $C_{K1}$ and $R_1$, to ground, bias current $J_R$ being supplied to the directional conductor over a high-frequency choke *Dr* and serves for the adjustment of the directional conductor resistance. Such bias is supplied, for example, from the regulating voltage source of the receiver or of the amplifier. This regulating voltage source is represented only by the current supply $J_R$. The dimensioning of the circuit for the initial values required is expected as follows.

The resistor $R_1$ between the two coupling capacitors is so selected that the required maximum transmission attenuation is achieved, that is, the transmission attenuation for a setting of the directional conductor bias current $J_R$ at a maximum value of say, 20 ma.

In this case the directional conductor acts in conjunction with unavoidable supply inductances such as the circuit of an ohmic and an inductive resistor. The equivalent circuit diagram of the amplifier section of FIG. 8 illustrated in FIG. 9.

$J_1$ is a current source which represents the input alternating current of the transistor $T_1$. Current supply from a source of very high internal resistance can here be assumed because of the common base circuit of the transistor $T_1$. Parallel to this current source there extends the capacitances $C_{11}$ and $C_C$, $C_C$ being the collector circuit capacitances of transistor T1, and $C_{11}$ being an additional capacitance which will be discussed later with the aid of FIG. 10. The current $J_1$ is divided into two branches, one of which consists of the resistance $R_1$, the input resistor $R_e$ of the following transistor stage T2 and the input inductance $L_e$ of the same stage, and through which there flows the input current $J_2$ of the second transistor $T_2$. The other current branch consists of the impedance of the directional conductor, with the ohmic component $R_R$ and the inductive component $L_R$. In series with $R_R$ and $L_R$ is the previously mentioned parallel circuit of $C_2$ and $R_2$. Through selection of the capacitance value of $C_2$ and the resistance value of $R_2$, the impedance value of the cross branch containing the series inductance of the directional conductor can be so set for maximum transmission attenuation of the four-pole that, over a great frequency range, there is achieved a practically frequency-independent current division $J_2/J_1$ between the parallel branch consisting of $R_R$, $L_R$, $C_2$, $R_2$, and the longitudinal branch consisting of $R_1$, $R_e$, $L_e$. The capacitances $C_C$ and $C_{11}$ are high ohmic with respect to the parallel branch and with the adjustment for maximal transformation attenuation—that is, with low-ohmic directional conductor, they have no appreciable influence in the pass range of the amplifier upon its amplitude-dependence on the operating frequency (amplitude course). The fine adjustment of the amplitude course in this regulating state is accomplished with the aid of the capacitor $C_2$, which, for example, is constructed as a trimmer capacitor. The setting of the trimmer is accomplished in such a way that in this regulating state of the stage the resulting pass curve is as flat as possible in the transmission range, that is $$\frac{J_2}{J_1}=\text{const.}$$

When the diode resistance is at the maximum value, that is, for minimum transmission attenuation of the network, practically no direct current flows through the directional conductor. The directional conductor in this case acts as a capacitance $C_R$. The equivalent circuit diagram for this actuation, that is, for minimal transmission attenuation of the network is represented in FIG. 10.

In FIG. 10, extending parallel to the current source $J_1$ is the parallel circuit of capacitors $C_C$, $C_{11}$ and $C_R$. The elements of the longitudinal branch $R_1$, $R_e$, $L_e$ are the same as in FIG. 9. The network accordingly has a low-past character. Through the variable capacitor $C_{11}$, which is constructed, for example, as a trimmer capacitor, the total capacitance can be adjusted in the parallel branch and there thus can be achieved a maximally flat amplitude course. For this it is necessary that the following equation be fulfilled:

$$C_C+C_{11}+C_R=\frac{2L_e}{(R_1+R_e)^2}$$

It is advantageous if the limit frequency of the low pass lies as far as possible above the transformation frequency band. The limit frequency of the network is given by the equation $$\omega_g=\frac{1}{L_e(C_C+C_{11}+C_R)}$$

Generally it is sufficient if the limit frequency has double the valve of the higheset frequency of the transmission frequency band. In this case, then, practically the entire signal alternating current flows through the network without attenuation, that is, the current ratio $J_2/J_1$ is then practically constant and equal to 1.

With such a dimensioning of the circuits according to FIG. 8, the amplitude course of the coupling network, in the transmission frequency range, remains practically constant at all settings of the directional conductor bias current between maximum and minimum attenuation. Also the transit time course of the attenuation network is, from a practical standpoint, no longer troublesome, because the limit frequency of the low pass formed by the attenuation four-pole lies far above the highest operating frequency.

The circuit according to the invention is distinguished, therefore, by a flat pass curve and a practically constant group transit time for a very great band width within the entire regulating range. Further, the pass curve is adjustable at minimum and maximum values of the attenuation independently of one another with respective trimmer capacitors and the minimum value of the attenuation of the coupling network can be made practically equal to zero decibels.

In utilization of the circuit according to the invention, for uniform regulation in amplifiers, an attenuation regulating range up to about 15 db is attainable without difficulty. In wide-band amplifiers, in which great demands are placed on the transit time course, on the amplitude course and on the noise ratio of the amplifier, it is advantageous not to exceed a regulating range of about 10 db. The amplification of the preceding stage should be adapted to the maximum attenuation of the subsequent attenuation regulator, that is, it ought to be about equal thereto.

The wide-band amplifier of the invention is of particular importance for the transmission of angle-modulated electrical waves, there being designated thereby, as is well known, electrical waves modulated in phase or frequency.

I claim:

1. A multistage broad-band transistor amplifier comprising, a coupling network between at least two consecutive amplifier stages and including a transformer connected between two of the multistage amplifiers, an attenuation series resonant circuit connected in parallel with the transformer, the coupling network between a pair of stages of the amplifier including a parallel resonant circuit having a capacity determined by the output capacity of the transistor amplifier preceding the coupling network and an inductance formed by the input impedance of the transistor stage following the coupling network and including the stray inductance of the transformer in series, and said series resonant circuit and the parallel resonant circuit forming a low pass filter which has a maximum flat transmission characteristic.

2. A multistage broad-band transistor amplifier according to claim 1, wherein the parallel series resonant circuit comprises a resistor to lower the Q of the series resonant circuit, and the resonant frequency of the series resonant circuit being appreciably below the upper limit frequency of the amplifier and lying in the vicinity of one-half the limit frequency of the amplifier.

3. A multistage wide-band transistor amplifier according to claim 1 in which the parallel connected series resonant circuit is connected on the secondary side of the transformer and comprises a resistor, and a capacitor which in combination with the stray inductance of the transformer forms a series resonant circuit.

4. A multistage wide-band transistor amplifier according to claim 1 wherein said transformer is an auto transformer.

5. A multistage wide-band transistor amplifier according to claim 1 wherein the transformer is constructed so as to have a high inductance and a minimum stray inductance.

6. A multistage wide-band transistor amplifier according to claim 1 comprising a coupling capacitor connected between said transformer and the preceding transistor amplifier stage and the capacitance of said coupling capacitor being so high that the lower limit frequency of the amplifier lies below the lower limit frequency of the desired pass band.

7. A multistage wide-band transistor amplifier according to claim 1 wherein the transformer coupling and the series resonant circuit are selected so that the upper cutoff frequency of the amplifier is substantially above the upper cutoff frequency of the desired pass band.

References Cited

UNITED STATES PATENTS

| | | | |
|---|---|---|---|
| 2,811,590 | 10/1957 | Doremus et al. | 330—21 X |
| 3,222,609 | 12/1965 | Ulmer et al. | 330—29 |

FOREIGN PATENTS

| | | |
|---|---|---|
| 909,776 | 11/1962 | Great Britain. |

JOHN KOMINSKI, Primary Examiner

SIEGFRIED H. GRIMM, Assistant Examiner

U.S. Cl. X.R.

330—29, 31, 143, 144, 167